(12) United States Patent
Takeuchi et al.

(10) Patent No.: US 8,022,436 B2
(45) Date of Patent: Sep. 20, 2011

(54) LIGHT EMITTING DIODE, PRODUCTION METHOD THEREOF AND LAMP

(75) Inventors: Ryouichi Takeuchi, Chichibu (JP); Kyousuke Masuya, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/620,977

(22) Filed: Nov. 18, 2009

(65) Prior Publication Data

US 2010/0123161 A1    May 20, 2010

(30) Foreign Application Priority Data

Nov. 19, 2008   (JP) .................................. 2008-295827

(51) Int. Cl.
   *H01L 51/40*   (2006.01)
(52) U.S. Cl. ............................... 257/99; 257/81; 257/79
(58) Field of Classification Search .................... 257/79, 257/81, 99
   See application file for complete search history.

(56) References Cited

FOREIGN PATENT DOCUMENTS

| JP | 06-088973 A | 3/1994 |
|----|---|---|
| JP | 2540791 B2 | 7/1996 |
| JP | 2001-244505 A | 9/2001 |
| JP | 2007-220709 A | 8/2007 |
| JP | 2008-258615 A | 10/2008 |

*Primary Examiner* — Long Pham
(74) *Attorney, Agent, or Firm* — Sughrue Mion, PLLC

(57) ABSTRACT

A light emitting diode includes a substrate, a compound semiconductor layer including a light emitting layer formed on the substrate, a first electrode formed on an upper surface of the compound semiconductor layer, and a second electrode formed on the substrate or a semiconductor layer which is exposed by removing at least a portion of the compound semiconductor layer. The first electrode includes a wiring electrode provided on the compound semiconductor layer in contact therewith, an ohmic electrode provided on the compound semiconductor layer in contact therewith, a translucent electrode formed over the compound semiconductor layer to cover the wiring electrode and the ohmic electrode, and a bonding pad electrode connected to the wiring electrode, at least a portion of the bonding pad electrode being exposed from an opening of the translucent electrode to the exterior.

19 Claims, 6 Drawing Sheets

LIGHT EMITTING DIODE, PRODUCTION METHOD THEREOF AND LAMP

CROSS REFERENCE TO RELATED APPLICATIONS

Priority is claimed on Japanese Patent Application No. 2008-295827, filed Nov. 19, 2008.

BACKGROUND OF THE INVENTION

1. Field of the Invention

The present invention relates to a light emitting diode with a compound semiconductor layer stacked on a substrate, a production method thereof and a lamp.

2. Description of Related Art

As a light emitting diode (LED) capable of emitting a visible light of a red color, an orange color, a yellow color or a yellowish-green color; a compound semiconductor LED that is equipped with a light emitting layer formed of an aluminum-gallium-indium phosphide $((Al_xGa_{1-x})_YIn_{1-Y}P$ in which ($0 \leq X \leq 1$, $0 < Y \leq 1$)) has been hitherto known. In LEDs of this kind, a compound semiconductor layer having a light emitting layer made of $(Al_xGa_{1-x})_YIn_{1-Y}P$ in which ($0 \leq X \leq 1$, $0 < Y \leq 1$) is generally formed on a substrate material, such as gallium arsenide (GaAs) which is optically opaque to the light emitted from the light emitting layer and does not have a high mechanical strength.

The light emitting diode described above has a device characteristic of a little current diffusion in a lateral direction. For this reason, there is a problem in that an electric current is introduced into only a region of the compound semiconductor layer immediately below an electrode and thus the light emitted from the light emitting layer is blocked by the electrode, so that the light could not be emitted to the outside. Such a light emitting diode generally has a configuration in which a translucent electrode is stacked on the compound semiconductor layer, and a metal electrode is provided on the translucent electrode, so that the light is emitted through the translucent electrode (e.g., see Japanese Unexamined Patent Application Publication No. H6-88973, Japanese Patent No. 2540791, Japanese Unexamined Patent Application Publication No. 2001-244505, Japanese Unexamined Patent Application Publication No. 2007-220709, and Japanese Unexamined Patent Application Publication No. 2008-258615). According to the light emitting diode disclosed in Japanese Unexamined Patent Application Publication No. H6-88973, Japanese Patent No. 2540791, and Japanese Unexamined Patent Application Publication No. 2001-244505, a known conductive material such as Ni/Au or ITO is used as the translucent electrode to enhance the light extraction efficiency, thereby obtaining a configuration of enhanced luminance.

However, as the light emitting diode disclosed in Japanese Unexamined Patent Application Publication No. H6-88973, Japanese Patent No. 2540791, Japanese Unexamined Patent Application Publication No. 2001-244505, Japanese Unexamined Patent Application Publication No. 2007-220709, and Japanese Unexamined Patent Application Publication No. 2008-258615, the configuration, in which the translucent electrode is stacked on the compound semiconductor layer and the metal electrode is formed thereon, has the following problems (in the description below, see FIG. 9).

First, in the case where the metal electrode is formed on the translucent electrode, when the surface of the semiconductor layer is processed to become rough state for the purpose of enhancing the light extraction efficiency, the adhesion strength between the metal electrode and the translucent electrode is likely to be deteriorated or the metal electrode is likely to be disconnected. Therefore, as described above, it is difficult to apply a technique for improving light extraction due to roughening of the surface of the semiconductor layer.

Further, since the entire metal electrode is exposed from the wafer, the metal electrode may be damaged during each process of producing the light emitting diode or a process of assembling various devices employing the light emitting diode. In particular, since the wiring electrode is formed in a simply elongated shape, the wiring electrode may be disconnected, if it is not treated properly.

In addition, in order to enhance the adhesion in the case where the metal electrode is formed on the translucent electrode, a metal thin film layer, for example, a Cr layer or a Ti layer, for enhancing the adhesion is generally formed at an interface. However, since the Cr layer or the like has a property of easily absorbing the light, in the case where the Cr layer or the like is formed on the translucent electrode, the light extraction efficiency of the light emitting diode is deteriorated, and the added process causes an increase in cost.

SUMMARY OF THE INVENTION

An advantage of some aspects of the invention is to provide a light emitting diode having increased productivity and enhanced light extraction efficiency and luminance, a production method thereof and a lamp employing the light emitting diode.

After considering thoroughly a method for increasing the productivity of the light emitting diode and enhancing the luminance thereof, the inventors find that by improving the electrode structure on the compound semiconductor layer, an electric current can easily flow between the electrode and the compound semiconductor layer. Also, since the surface of the semiconductor layer for enhancing light extraction efficiency can be roughened, high luminance and improved productivity can be achieved. As a result, the inventions below have been completed.

That is, the present invention provides the followings inventions.

(1) A light emitting diode including: a substrate; a compound semiconductor layer including a light emitting layer formed on the substrate; a first electrode formed on an upper surface of the compound semiconductor layer; and a second electrode formed on the substrate or a semiconductor layer which is exposed by removing at least a portion of the compound semiconductor layer; the first electrode includes a wiring electrode provided on the compound semiconductor layer in contact therewith; an ohmic electrode provided on the compound semiconductor layer in contact therewith; a translucent electrode formed over the compound semiconductor layer to cover the wiring electrode and the ohmic electrode; and a bonding pad electrode connected to the wiring electrode, at least a portion of the bonding pad electrode being exposed from an opening of the translucent electrode to the exterior.

(2) The light emitting diode according to the above-described 1, wherein the translucent electrode is made of indium tin oxide (ITO).

(3) The light emitting diode according to the above-described 1 or 2, wherein the resistivity of the wiring electrode is 20 mΩcm or less, and the resistivity of the translucent electrode is 1 mΩcm or less.

(4) The light emitting diode according to any one of the above-described 1 to 3, wherein the relationship of a thickness t1 of the wiring electrode, a thickness t2 of the ohmic electrode, a thickness t3 of the translucent electrode and a thickness t4 of the bonding pad electrode is expressed in the following equation, $$t4 > t3 > t2, t1.$$

(5) The light emitting diode according to any one of the above-described 1 to 3, wherein the relationship of a thickness t1 of the wiring electrode, a thickness t2 of the ohmic electrode, a thickness t3 of the translucent electrode and thickness t4 of the bonding pad electrode satisfies equations (1) to (3) below:

$$t4 > 2 \times t3 \tag{1}$$

$$t3 > 1.25 \times t2 \tag{2}$$

$$t3 > 1.25 \times t1 \tag{3}$$

(6) The light emitting diode according to any one of the above-described 1 to 5, wherein the reflectivity of the wiring electrode and the reflectivity of the bonding pad electrode are more than 90% with respect to light emitted from the compound semiconductor layer having the light emitting layer.

(7) The light emitting diode according to any one of the above-described 1 to 6, wherein the wiring electrode is provided on at least a portion of the compound semiconductor layer, and the total length of the wiring electrode is 1 mm or more.

(8) The light emitting diode according to any one of the above-described 1 to 7, wherein the wiring electrode includes an Au film or an Ag film, and the bonding pad electrode includes a Pt film and an Au film which are sequentially stacked in a pad formation region on the wiring electrode.

(9) The light emitting diode according to any one of the above-described 1 to 8, wherein at least a portion of a surface of the compound semiconductor layer is formed to be in a rough state, the translucent electrode being formed on the surface of the compound semiconductor layer.

(10) The light emitting diode according to any one of the above-described 1 to 9, wherein the substrate is made of a translucent material.

(11) The light emitting diode according to the above-described 10, wherein the substrate is made of GaP.

(12) The light emitting diode according to any one of the above-described 1 to 11, wherein the compound semiconductor layer is composed of a p-type semiconductor layer, a light emitting layer and an n-type semiconductor layer which are sequentially stacked on a main surface of the substrate.

(13) The light emitting diode according to the above-described 12, wherein the first electrode is an n-type electrode formed on the n-type semiconductor layer, and the second electrode is a p-type electrode formed in an exposed region on the p-type semiconductor layer or the main surface of the substrate.

(14) The light emitting diode according to any one of the above-described 1 to 13, wherein the light emitting layer is made of a Group III-V compound semiconductor.

(15) The light emitting diode according to the above-described 14, wherein the light emitting layer is made of a GaP based compound semiconductor.

(16) The light emitting diode according to the above-described 14, wherein the light emitting layer is made of an AlGaInP based compound semiconductor.

(17) A method of producing the light emitting diode according to any one of the above-described 1 to 16, including: an epitaxial step of forming a compound semiconductor layer by stacking at least an n-type semiconductor layer, a light emitting layer and a p-type semiconductor layer in this order on a substrate for epitaxial growth; a bonding step of bonding the compound semiconductor layer and a substrate: a removing step of removing the substrate for epitaxial growth from the compound semiconductor layer to expose a light emitting surface and thus form a stacked semiconductor wafer; a second electrode forming step of forming a second electrode in an exposed region by removing at least a portion of the compound semiconductor layer to expose the main surface of the substrate; a first electrode forming step of forming a first electrode by forming a wiring electrode on the compound semiconductor layer, forming an ohmic electrode on the compound semiconductor layer, forming a bonding pad electrode in a pad formation region on the wiring electrode, exposing at least a portion of the bonding pad electrode, and forming a translucent electrode formed over the compound semiconductor layer to cover the wiring electrode and the ohmic electrode; and a separating step of cutting the stacked semiconductor wafer element unit chips.

(18) A light emitting diode obtained by the production method according to the above-described 17.

(19) A lamp employing the light emitting diode according to any one of the above-described 1 to 16, or 18.

With the light emitting diode according to the invention; since the first electrode formed on the compound semiconductor layer includes the wiring electrode provided on the compound semiconductor layer in contact therewith, the ohmic electrode provided on the compound semiconductor layer in contact therewith, the translucent electrode formed over the compound semiconductor layer to cover the wiring electrode and the ohmic electrode, and the bonding pad electrode connected to the wiring electrode, at least a portion of the bonding pad electrode being exposed from an opening of the translucent electrode to the exterior; it is possible to subject the surface of the compound semiconductor layer having the light emitting layer to a roughening process; so that the light extraction efficiency from the light emitting layer is enhanced; and the high luminance is achieved. Also, since the translucent electrode protects the wiring electrode and the ohmic electrode, it is possible to prevent the electrode from being damaged during a production process or the like, and to increase the number of defects. Further, since the wiring electrode and the ohmic electrode are directly bonded onto the compound semiconductor layer, it is not necessary to provide a Cr layer having light absorption, or the like, and the light extraction efficiency and the luminance can be enhanced. Also, since the process of forming or patterning the Cr layer the like may be omitted, it is possible to lower production cost.

Accordingly, a light emitting diode having an excellent productivity, a high yield, and an excellent light extraction efficiency which enhances the luminance of the light emitting diode, can be achieved.

Since the lamp employs the light emitting diode of the invention, the lamp of the invention improves the light emission characteristics.

DETAILED DESCRIPTION OF THE INVENTION

Figure 1:
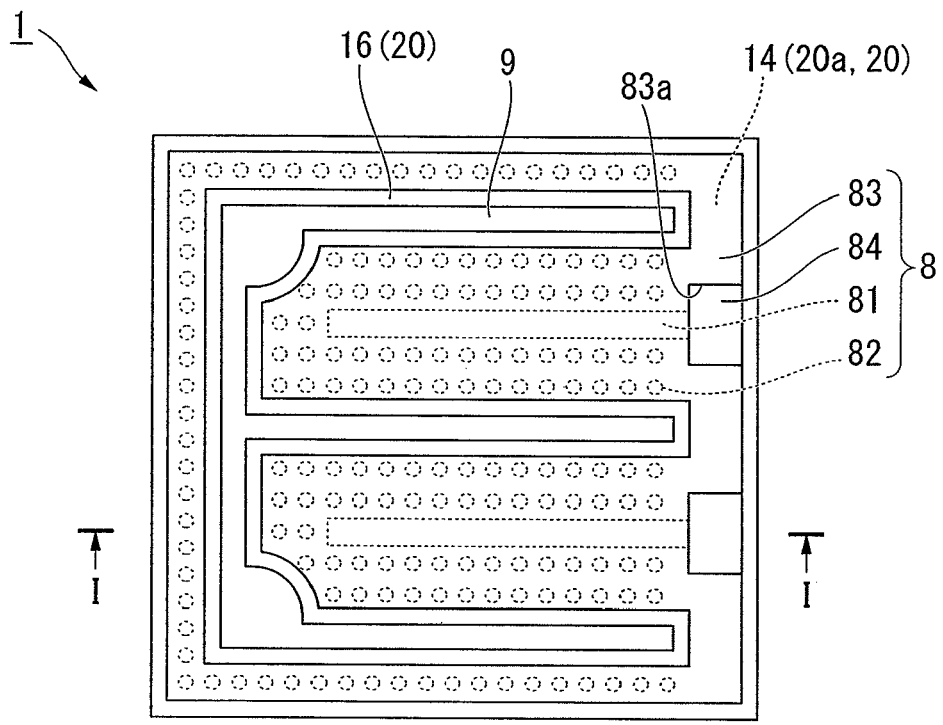
FIG. 1 is a plan view schematically showing a light emitting diode according to an embodiment of the invention.
Figure 2:
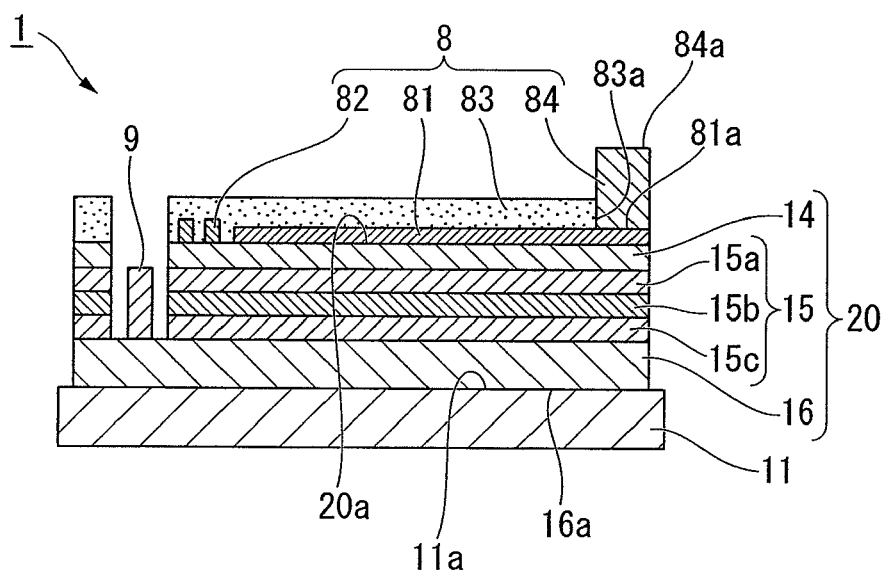
FIG. 2 is a cross-sectional view taken along the line I-I in FIG. 1 to schematically show a light emitting diode according to an embodiment of the invention.
Figure 6:
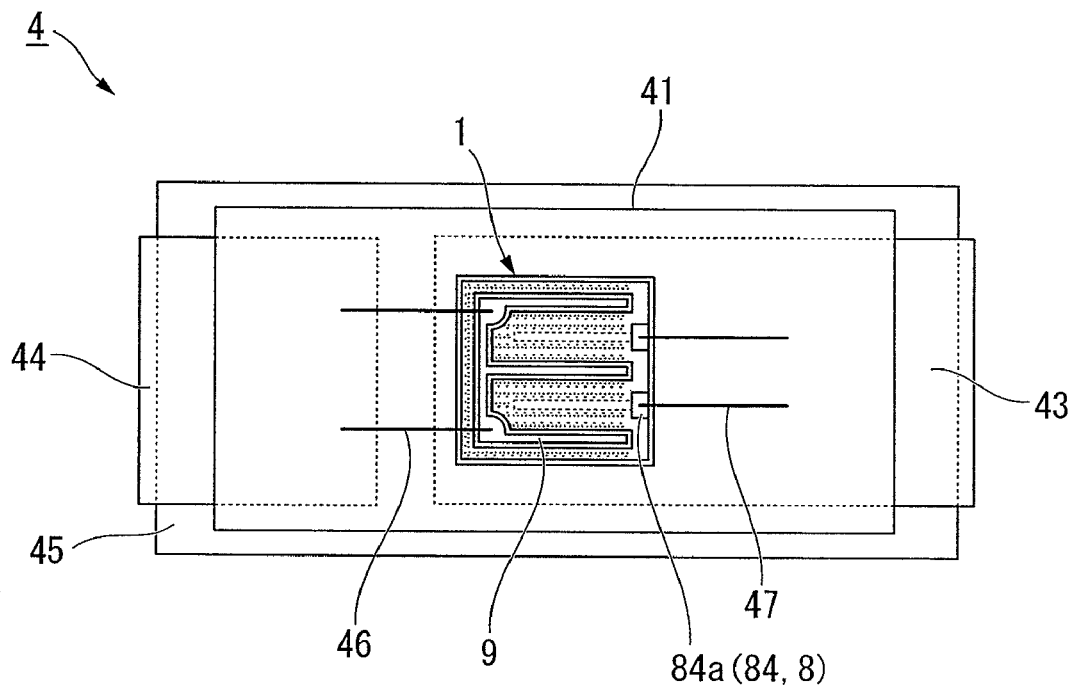
FIG. 6 is a plan view schematically showing a lamp employing a light emitting diode according to an embodiment of the invention.
Figure 7:
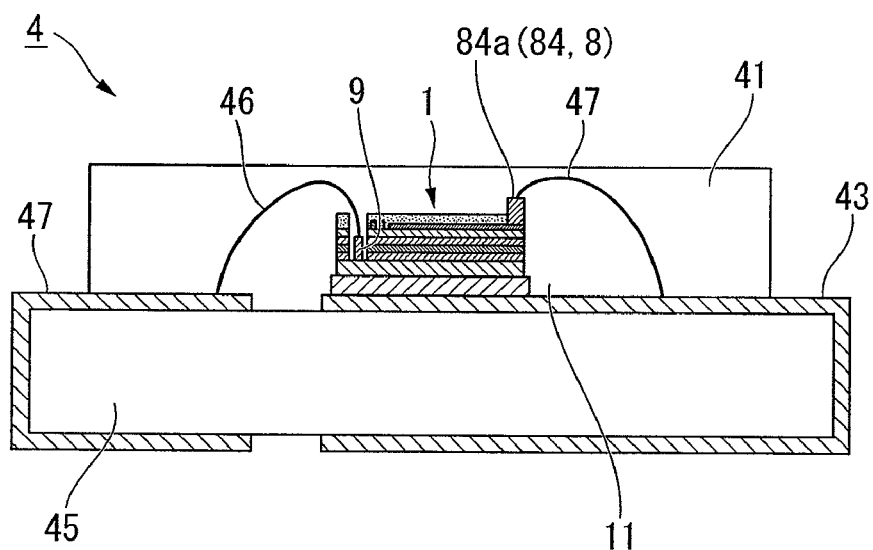
FIG. 7 is a cross-sectional view taken along the line K-K in FIG. 6 to schematically show a light emitting diode according to an embodiment of the invention.

A light emitting diode, a production method thereof and a lamp according to an embodiment of the invention will now be described with reference to the accompanying drawings. FIG. 1 is a plan view schematically showing the light emitting diode according to the embodiment of the invention. FIG. 2 is a cross-sectional view of the light emitting diode shown in FIG. 1. FIGS. 3, 4, 5A to 5D are views schematically explaining a method of producing the light emitting diode according to the embodiment, and a cross-sectional view showing a layer structure of a semiconductor stacked wafer. FIGS. 6 and 7 are cross-sectional views of the lamp employing the light emitting diode according to the embodiment. The figures referenced in the description below show and explain the light emitting diode, the production method thereof and the lamp according to the embodiment, in which dimensions, such as size or thickness, of each shown portion are different from those of a real light emitting diode or the like. Although not shown, a portion of a surface of a compound semiconductor layer 20 is subjected to a roughening process.

Stacked Structure of Light Emitting Diode (Stacked Semiconductor Wafer)

A light emitting diode 1 according to the embodiment includes, as shown in FIGS. 1 and 2, a substrate 11, a compound semiconductor layer 20 including a light emitting layer 15 formed on the substrate 11, an n-type electrode (i.e., a first electrode) 8 formed on an upper surface of the compound semiconductor layer 20, and a p-type electrode (i.e., a second electrode) 9 formed on a p-type semiconductor layer 16 which is exposed by removing at least a portion of the compound semiconductor layer 20. The n-type electrode 8 includes a wiring electrode 81 provided on the compound semiconductor layer 20 in contact therewith, an ohmic electrode 82 provided on the compound semiconductor layer 20 in contact therewith, a translucent electrode 83 formed over the compound semiconductor layer 20 to cover the wiring electrode 81 and the ohmic electrode 82, and a bonding pad electrode 84 connected to the wiring electrode 81 and having a contact portion 84a which is exposed from an opening 83a of the translucent electrode 83 to the exterior.

The stacked structure of the light emitting diode 1 according to the embodiment will now be described.

Substrate

Preferably, the light emitting diode 1 according to the embodiment employs a translucent substrate made of, for example, a GaP single crystal as the substrate 11. In general, material for use in the substrate of the light emitting diode includes sapphire ($\alpha$-$Al_2O_3$ single crystal), glass, silicon carbide (SiC), gallium phosphide (GaP), silicon (Si), germanium (Ge), AlN, GaN, and so forth. It is preferable that if one of the above materials is used as the translucent material, the light extraction efficiency of the light emitting diode is enhanced thereby improving luminance. Among them, GaP is the most preferable since it has physical properties approximate to those of a light emitting layer 15 described below, as well as workability and mass productivity. Also, a single-crystal substrate is preferably used as a material of the substrate, but an amorphous material, such as, glass or ceramic, may be used.

More preferably, a material having physical properties, such as, coefficient of thermal expansion and index of refraction, approximate to those of a material used as the light emitting layer 15 described below is used as a material of the substrate 11. For example, in the case of using the light emitting layer made of AlGaInP, a substrate made of GaP is used, while in the case of using a light emitting layer made of GaInN, a substrate made of GaN is used. That is, various combinations may be employed.

Also, the substrate 11 generally has a diameter of about 2 inches or about 3 inches, but the invention is not limited thereto. For example, a large substrate, such as a round substrate having a diameter of 4 to 6 inches, or a rectangular substrate may be used.

In the light emitting diode according to the invention, in the case where the substrate 11 is made of a single crystal, the crystal plane orientation of the main surface 11a is not limited to a specific one, but it is preferably selected to increase productivity and allow the substrate to be easily machined. In this embodiment, it is preferable that the main surface 11a of the substrate 11 made of GaP has (111) crystal plane orientation which can increase the productivity in mass production.

In the light emitting diode 1 according to the embodiment, light emitted from the light emitting layer 15 provided on the compound semiconductor layer 20 described below enters the substrate 11 via the main surface 11a. By using a configuration capable of emitting the light incident on an inside of the substrate 11 from each lateral surface of the substrate 11, the luminance of the light emitting diode 1 can be further increased.

Further, a mirror substrate may be applied as the substrate 11, the mirror substrate having a reflective structure formed between an opaque substrate and a semiconductor layer. General purpose Si is contained in the opaque substrate, which is preferable in view of machining technique, cost, productivity and so forth.

Compound Semiconductor Layer

As shown in FIGS. 1 and 2, the compound semiconductor layer 20 is formed on the main surface 11a of the substrate 11, the compound semiconductor layer 20 being composed of a p-type semiconductor layer 16, the light emitting layer 15 and the n-type semiconductor layer 14 formed in this order.

The compound semiconductor layer 20 described in this embodiment may be directly grown on the substrate 11, or may be previously formed on a substrate 30 for epitaxial growth (see FIGS. 3 and 4) which will be described in detail in a production method below, in which the light emitting diode 1 is formed by bonding a surface 16a of the p-type semiconductor layer 16 provided on the previously formed compound semiconductor layer 20 onto the main surface 11a of the substrate 11.

The compound semiconductor layer 20 according to the embodiment includes a stacked semiconductor structure having the light emitting layer 15, and, as shown in a schematically cross-sectional view of FIG. 2, on the main surface 11a of the substrate 11, the p-type semiconductor layer 16, the light emitting layer 15 and the n-type semiconductor layer 14 are sequentially stacked. It is preferable that the light emitting layer 15 uses a Group III-V compound semiconductor expressed in the general formula $(Al_XGa_{1-X})_YIn_{1-Y}P$ ($0 \leq X \leq 1$, $0 < Y \leq 1$). Also, InGaN having good light emitting efficiency or the like may be used as the light emitting layer 15 constituting the compound semiconductor layer 20.

As the most preferable embodiment of the compound semiconductor layer 20, an AlGaInP based material will now be described below.

The p-type semiconductor layer 16 doped with a specified quantity of, for example, Mg or Zn, has a p-type property. For example, the p-type semiconductor layer is a p-type contact layer made of GaP. As a material for doping Mg, for example, a known bis(cyclopentadienyl)magnesium (bis-$(C_5H_5)_2$Mg) may be used.

Also, in order to enhance the luminance, it is preferable in the invention that the p-type semiconductor layer 16 uses GaP, but a Group III-V compound semiconductor crystal, such as AlGaAs or AlGaInP, may be employed without any limitation.

As shown in FIGS. 1 and 2, in the light emitting diode 1 according to this embodiment, the p-type electrode (i.e., the second electrode) 9 described below is formed on the p-type semiconductor layer 16. In this configuration, if the p-type semiconductor layer 16 is made of, for example, GaP, the p-type semiconductor layer 16 is added with Zn to have a carrier concentration of approximately $1 \times 10^{18}$ cm$^{-3}$, and is preferably used as a single-crystal substrate having a p-type property.

The light emitting layer 15 is formed on the p-type semiconductor layer 16, and is composed of a p-type clad layer 15c, a multi-quantum well layer 15b and an n-type clad layer 15a which are stacked on the p-type semiconductor layer 16 in this order. More specifically, in the case of a light emitting diode emitting a light of red color, the p-type clad layer 15c is made of $(Al_{0.7}Ga_{0.3})_{0.5}In_{0.5}P$ doped with Mg, Zn or the like and has a p-type property. The p-type clad layer 15c has a bandgap larger than that of the multi-quantum well layer 15b. The multi-quantum well layer 15b has 20 pairs of barrier layers made of undoped $(Al_{0.2}Ga_{0.8})_{0.5}In_{0.5}P$ and well layers made of $(Al_{0.7}Ga_{0.3})_{0.5}In_{0.5}P$ which are alternatively stacked on each other. The n-type clad layer 15a is made of $(Al_{0.7}Ga_{0.3})_{0.5}In_{0.5}P$ doped with Si, Te or the like and has an n-type property. In this instance, it is constituted by a known light emitting layer 15 (multi-quantum well layer 15b) having a structure of the multi-quantum well layer or the like, and the configuration of the barrier layer and the well layer which are made of a composition of $(Al_XGa_{1-X})_YIn_{1-Y}P$ ($0 \leq X \leq 1$, $0 < Y \leq 1$) can be properly determined so as to obtain a desired emission wavelength. The composition, thickness, carrier concentration or the like of the barrier layer forming the p-type clad layer 15c, the n-type clad layer 15a, and the multi-quantum well layer 15b may be properly set to enhance the light emission efficiency. The light emitting diode according to the embodiment may have a layer structure of which an n-type polarity and a p-type polarity are alternated.

The light emitting layer 15 may be made of a material known in the related art, such as a GaInN based material or an AlGaAs based material, as well as the above-mentioned example. The light emitting layer 15 made of GaP based compound semiconductor which is directly grown on the GaP substrate is preferably used in consideration of an unnecessary bonding process. More preferably, the light emitting layer is made of a combination of the AlGaInP based substrate and the GaP substrate having a high light emitting efficiency.

The light emitting layer 15 provided on the light emitting diode 1 according to the embodiment is formed of a so-called p-n junction-type double hetero junction structure composed of the p-type clad layer 15c, the multi-quantum well layer 15b and the n-type clad layer 15a by the above configuration. The light emitting layer 15 may employ a known structure, such as a double hetero structure, so as to entrap a carrier.

As described above, the multi-quantum well layer 15b may be made of an n-type or a p-type compound semiconductor.

The light emitting layer 15 according to the embodiment is formed of a configuration having the multi-quantum well layer 15b made of a multiple quantum well (MQW) structure of the configuration, but the light emitting structure is not limited thereto. For example, a single quantum well (SQW) structure may be employed, in addition to the structure of the multi-quantum well, but the multiple quantum well structure is preferable for the purpose of obtaining light emission excelling in monochromaticity.

The light emitting layer 15 may be formed on the surface of the single-crystal substrate, such as lattice-matched GaAs and a Group III-V compound semiconductor containing InP, GaP or the like. In addition to the structure of the light emitting layer, a configuration including a known functional layer, for example, a contact layer, a current diffusion layer, and a current element layer, may be employed.

The n-type semiconductor layer 14 doped with a specified quantity of Si, Te, or Sn is formed on the light emitting layer 15, and has an n-type property. For example, the n-type semiconductor layer 14 is an n-type contact layer made of Si-doped $(Al_{0.5}Ga_{0.5})_{0.5}In_{0.5}P$. For example, disilane ($Si_2H_6$) may be used as a raw material for doping Si. Also, the composition, the thickness, the carrier concentration or the like of the n-type semiconductor layer 16 may be properly adjusted so as to optimally control an electric characteristic and an optical characteristic.

n-Type Electrode (First Electrode)

The n-type electrode 8 is an electrode made of a plurality of electrodes formed on the n-type semiconductor layer 14.

The n-type electrode 8 includes, as shown in FIGS. 1 and 2, the wiring electrode 81 provided on the n-type semiconductor layer 141n contact therewith, the ohmic electrode 82 provided on the n-type semiconductor layer 14 in contact therewith, the translucent electrode 83 formed over the n-type semiconductor layer 14 to cover the wiring electrode 81 and the ohmic electrode 82, and the bonding pad electrode 84 connected to the wiring electrode 81 and having the contact portion 84a which is exposed from the opening 83a of the translucent electrode 83 to the exterior. The n-type electrode 8 according to the embodiment is formed on the n-type semiconductor layer 14 to make the elongated wiring electrode 81 at two portions which are in parallel with each other.

The wiring electrode 81 is formed on the n-type semiconductor layer 14 in ohmic junction therewith, as described above, and is covered by the translucent electrode 83.

Preferably, the wiring electrode 81 utilizes a material having high reflectivity with respect to light emission at an interface in contact with the compound semiconductor layer 20. The reflectivity is preferably 90% or more, and more preferably 95% or more.

Also, it is preferable that since the wiring electrode 81 is formed in an elongated and thin shape, as the shown embodiment, the wiring electrode 81 is made of a material having as low electric resistance as possible. The material used as the wiring electrode 81 preferably has resistivity of 20 μΩcm or less. Preferably, the material is an Au film, an Ag film, an Al film, a Cu film, and so forth, and more preferably, the material is the Au film which is chemically stable.

The wiring electrode 81 is covered by the translucent electrode 83, so that a contact area between the wiring electrode 81 and the translucent electrode 83 is increased and an electric current easily flows between the electrodes. Therefore, a heat value is reduced in a high current region, so that the light emission efficiency of the light emitting layer 15 included in the compound semiconductor layer 20 is enhanced thereby to enhance the luminance of the light emitting diode 1.

The wiring electrode 81 may be made of, for example, the Au monolayer film as described above, and a configuration having a multi-layered film made of different material, such as a Ni film, a Pt film, a Cu film or the like, formed on the Au film may be used. The material and structure may be selected as appropriate in this configuration.

A thickness t1 of the wiring electrode 81 is necessarily thinner than the thickness of the translucent electrode 83 for the purpose of preventing disconnection of the translucent electrode 83. For example, it is preferable that the wiring electrode 81 have a thickness t1 of up to 0.8 times the thickness of the translucent electrode 83.

The wiring electrode 81 according to the embodiment may be directly formed on the n-type semiconductor layer 14. However, in the case where a metal wiring is formed over the translucent electrode 83 made of oxide such as ITO, a thin film (0.2 or less) of Ti, Cr or the like for improving adhesion is generally formed at an interface. The metal of Ti, Cr or the like is a material having low reflectivity of less than 90%. Since the metal is not used as the wiring electrode 81 in this embodiment, the inside absorption of light emitted from the light emitting layer 15 by the n-type electrode 8 is lowered in the light emitting diode 1, thereby enhancing the light extraction efficiency and thus enhancing the luminance of the light emitting diode 1. Further, in the case where the surface of the compound semiconductor layer 20 is roughened so as to enhance the light extraction efficiency, it is difficult for related art to uniformly form the Cr thin film or the Ti thin film on the uneven translucent electrode 83 as described above. Since the invention does not require the Cr thin film or the Ti thin film and the wiring electrode 81 is covered by the translucent electrode 83, the configuration preferably has stable adhesion or electric resistance even with respect to the uneven surface.

In this embodiment, since the translucent electrode 83 has a protective effect on the wiring electrode 81, an excellent effect can be obtained in the case where a long wiring electrode 81, of which a disconnection risk is very high, is applied to a large light emitting diode. In this embodiment, it is preferable that the total length of the wiring electrode 81 is 1 mm or more. In the case where the total length of the wiring electrode 81 is 1 mm or more, the effect of the present invention becomes clearer, because defects due to damage of the electrode are generally increased in the related art. However, in this preferable embodiment, the defects due to the damage are not increased.

The ohmic electrode 82 is formed on the n-type semiconductor layer 14 in ohmic junction therewith, similar to the wiring electrode 81, and is covered by the translucent electrode 83. The ohmic electrode 82 is uniformly disposed between the wiring electrode 81 and the p-type electrode 9 described below, as shown in a plan view of FIG. 1, and is disposed to enclose the p-type electrode 9 which is formed in a pectinate shape at planar view.

Since the ohmic electrode 82 is configured as described above, an electric current easily flows between the n-type semiconductor layer 14 and the translucent electrode 83, which enhances the light emission efficiency of the light emitting layer 15 and thus enhances the luminance of the light emitting diode 1 in a similar manner to the above.

The ohmic electrode 82 may use a known material and configuration, such as a monolayer film or stacked films, for example, AuGe/Ni/Au alloy films, similar to the wiring electrode 81, without any limitation.

A thickness t2 of the ohmic electrode 82 is necessarily thinner than the thickness of the translucent electrode 83 for the purpose of preventing disconnection of the translucent electrode 83. Preferably, the ohmic electrode 82 has a thickness t2 of equal to or less than 0.8 times the thickness of the translucent electrode 83.

The translucent electrode 83 is an electrode having translucency formed over the n-type semiconductor layer 14 to cover the wiring electrode 81 and the ohmic electrode 82 as described above.

The translucent electrode 83 may be made of any one selected from electrode materials having translucency known in the related art, for example, indium tin oxide (ITO: $In_2O_3$—$SnO_2$), AZO ($ZnO$—$Al_2O_3$), IZO ($In_2O_3$—$ZnO$), and GZO ($ZnO$—$Ga_2O_3$), and is not limited thereto. In particular, since the ITO is a mass-produced material with excellent resistivity and transmissivity, it is preferable. Further, as the translucent electrode 83, any material or structure, which is known in the related art, including a multi-layered structure, may be utilized without any limitation.

Preferably, the translucent electrode 83 has a resistivity of 1 mΩcm or less. If the resistivity of the translucent electrode 83 is higher than 1 mΩcm, a high VF causes an increase in consumption power or non-uniform current diffusion.

Preferably, the thickness t3 of the translucent electrode 83 is thicker than that of the wiring electrode 81 or the ohmic electrode 82. There is no limitation on thickening of the translucent electrode 83, but since the material of the translucent electrode 83 is expensive, the required minimum thickness is preferably set in consideration of the cost. More specifically, the range of the thickness is preferably set to be equal to or more than 0.1 μm and equal to or less than 1 μm for practical purposes.

The bonding pad electrode 84 is a bonding pad formed by stacking, for example, an Au film on the pad formation region 81a on the wiring electrode 81 made of the Au film as described above. Also, the bonding pad electrode 84 has a contact portion 84a exposed through an opening 83a formed in the translucent electrode 83, as shown in FIG. 2, and comes in contact with the exterior via a bonding wire.

The bonding pad electrode 84 is not limited to the above-mentioned material or structure, and may be applied to a material and structure known in the related art, such as a multi-layered film, without any limitation.

Preferably, the bonding pad electrode 84 uses a material having reflectivity of 90% or more, of which light absorption is small, for the purpose of enhancing the light extraction efficiency of the light emitting diode and of obtaining high luminance.

The bonding pad electrode 84 preferably has a thickness t4 as thick as possible in order to obtain adhesion strength to the wire bonding, and it is preferable that it has a thickness thicker than 1 μm. Accordingly, the bonding pad electrode 84 has a thickness t4 thicker than the thickness t3 of the translucent electrode 83, preferably, the thickness is two or more times as thick as the thickness t3.

In the n-type electrode 8 according to the embodiment, the relationship of the thickness t1 of the wiring electrode 81, the thickness t2 of the ohmic electrode 82, the thickness t3 of the translucent electrode 83 and the thickness t4 of the bonding pad electrode 84 is expressed in the following equation, $$t4 > t3 > t2, t1.$$

Also, the relationship of the thickness t1 of the wiring electrode 81, the thickness t2 of the ohmic electrode 82, the thickness t3 of the translucent electrode 83 and the thickness t4 of the bonding pad electrode 84 satisfies equations (1) to (3) below, respectively:

$$t4 > 2 \times t3 \qquad (1)$$

$$t3 > 1.25 \times t2 \qquad (2)$$

$$t3 > 1.25 \times t1 \qquad (3)$$

In this embodiment, if the thickness of the respective electrodes constituting the n-type electrode 8 forms the above relationship, the effect obtained when the thickness of the respective electrodes is set to a preferable range is more remarkable.

With the n-type electrode 8 having the configuration according to the embodiment, the ohmic electrode 82 is uniformly disposed between the wiring electrode 81 and the p-type electrode 9 to enclose the p-type electrode 9, so that the electric current is effectively diffused over the entire semiconductor layer 20 (the light emitting layer 15). Therefore, it can obtain an effect that the light emitting layer 15 effectively emits light and the luminance of the light emitting diode 1 is significantly enhanced.

Also, the wiring electrode 81 and the ohmic electrode 82 come in direct contact with the n-type semiconductor layer 14, and the wiring electrode 81 and the ohmic electrode 82 are covered by the translucent electrode 83, so that the electric current easily flows in the entire semiconductor layer 20. Accordingly, the light emitting efficiency of the light emitting layer 15 can be increased and thus the luminance can be further enhanced.

Also, since the translucent electrode 83 protects the wiring electrode 81 and the ohmic electrode 82, it is possible to prevent a surface of the electrode from being damaged, for example, during a production process of the lamp.

Further, with the above configuration of the bonding pad electrode 84, there is an effect that sufficient thickness of the pad can be ensured to reliably bond a bonding wire.

Although the configuration, in which the bonding pad electrode 84 is formed on the wiring electrode 81 provided on the light emitting surface 20a of the compound semiconductor layer 20 in contact therewith, is described in this embodiment, the configuration may be properly employed, for example, the above electrodes may be integrally formed.

p-Type Electrode (Second Electrode)

The p-type electrode 9 is formed on the p-type semiconductor layer 16, and is provided on the exposed region in which at least a portion of the compound semiconductor layer 20 composed of the p-type semiconductor layer 16, the light emitting layer 15 and the n-type semiconductor layer 14 which are sequentially stacked is removed. Therefore, when the p-type electrode 9 is formed, the exposed region 11c of the substrate 11 is formed by removing at least a portion of the semiconductor layer 20, the p-type electrode 9 is formed on the exposed region. In the embodiment shown in FIG. 1, the semiconductor layer 20 is removed in a pectinate shape (i.e., E-shape) at planar view, so that the p-type electrode 9 formed in the pectinate shape at planar view is formed on the removed region of the p-type semiconductor layer 16. Further, in the shown embodiment, the elongated wiring electrode 81 as described above is formed between teeth of the p-type electrode 9 formed in the pectinate shape at planar view.

The p-type electrode 9 may be made of various materials by using means widely known in the art, and have various known configurations, for example, a stacked layer composed of AuBe, AuZn alloy, and an Au film. Also, any construct of the p-type electrode 9 can be applied without any limitation.

As described above, since the plurality of ohmic electrodes 82 are evenly disposed between the p-type electrode 9 formed in the pectinate shape at planar view and the wiring electrode 81 in this embodiment, the electric current is diffused over the entire semiconductor layer 20 to increase the light emitting efficiency thereof.

Although the configuration in which the p-type electrode 9 is formed in the pectinate shape at planar view is explained in this embodiment, the invention is not limited thereto. For example, as long as the arrangement relationship between the p-type electrode 9 and the n-type electrode 8 is adjusted and the electric current is uniformly supplied to the compound semiconductor layer 20 having the light emitting layer 15, the structure or the material is not limited. Further, in the case where a mirror substrate is utilized as the substrate, an electrode may be formed on a rear surface of the substrate.

As described above, according to the light emitting diode 1 of the invention, the n-type electrode 8 includes the wiring electrode 81 provided on the compound semiconductor layer 20 in contact therewith, the ohmic electrode 82 provided on the compound semiconductor layer 20 in contact therewith, the translucent electrode 83 formed over the compound semiconductor layer 20 to cover the wiring electrode 81 and the ohmic electrode 82, and the bonding pad electrode 84 connected to the wiring electrode 81 and having the contact portion 84a which is exposed from the opening 83a of the translucent electrode 83 to the exterior. The electric current can easily flow between the compound semiconductor layer 20 having the light emitting layer 15 and n-type electrode 8 to enhance the luminance of the light emitted from the light emitting layer 15.

Further, the bonding pad electrode 84 has a configuration in which the contact portion 84a is exposed from the opening 83a of the translucent electrode 83, so that sufficient thickness is ensured to reliably bond the binding wire and prevent wiring defect or the like.

Since the wiring electrode 81 and the ohmic electrode 82 are protected by the translucent electrode 83, it is possible to suppress the electrode from being damaged during the production process or the like.

In addition, since the wiring electrode 81 and the ohmic electrode 82 are directly bonded to the n-type semiconductor layer 14, it is not necessary to form the Cr layer or the like at the interface, similar to the case where the metal electrode is formed on the translucent electrode. Because the Cr layer having the light absorption is not necessary, the light extraction efficiency is enhanced, and the luminance is enhanced. Also, since a film formation process of the Cr layer can be omitted, it is possible to reduce the production cost.

The high productivity causes the increase in yield ratio, and the excellent light extraction efficiency enhances the luminance of the light emitting diode.

Also, the invention is not limited to the light emitting diode of a coplanar electrode type according to the embodiment shown in FIGS. 1 and 2, the same effect can be obtained if it is applied to a light emitting diode of a vertical electrode type in which an ohmic electrode is formed on a semiconductor substrate, such as GaP, or a metal substrate. In this instance, it is possible to achieve a light emitting diode of vertical electrode type having excellent luminance.

In addition to the AlGaInP-based light emitting diode according to the embodiment, in which the compound semiconductor layer is bonded onto the substrate made of GaP and having (111) crystal plane orientation, the invention may be easily applied to yellow-green to red light emitting diodes which are obtained by epitaxially growing a compound semiconductor layer having a light emitting layer on a single-crystal substrate made of GaP and having (111) crystal plane orientation through am MOCVD method, which is a preferable embodiment having a good effect. Also, a light emitting layer made of InGaN and having good light emission efficiency can obtains a good effect and is thus preferable.

Method of Producing Light Emitting Diode

The method of producing a light emitting diode 1 according to the embodiment includes an epitaxial process of forming the compound semiconductor layer 20 by stacking at least the n-type semiconductor layer 14, the light emitting layer 15 and the p-type semiconductor layer 16 in this order on the substrate 30 for epitaxial growth; a bonding process of bonding the compound semiconductor layer 20 and a substrate 11; a removing process of removing the substrate 30 for epitaxial growth from the compound semiconductor layer 20 to expose the light emitting surface 20a and thus form the stacked semiconductor wafer 21; a second electrode (p-type electrode) forming process of forming the p-type electrode (the second electrode) 9 in the exposed region by removing at least a portion of the compound semiconductor layer 20 to expose the p-type semiconductor layer 16; a first electrode (n-type electrode) forming process of forming the wiring electrode 81 on the compound semiconductor layer 20, forming the ohmic electrode 82 on the compound semiconductor layer 20, forming the bonding pad electrode 84 in the pad formation region 81c on the wiring electrode 81, and forming the translucent electrode 83 formed over the compound semiconductor layer 20 to cover the wiring electrode 81 and the ohmic electrode 82 while exposing the contact portion 84a of the bonding pad electrode 84 to exterior; and a separating process of cutting the stacked semiconductor wafer 21 into element unit chips to form the light emitting diode 1.

The production method according to the embodiment is a method of producing the light emitting diode 1 of a coplanar electrode type shown in FIGS. 1 and 2 by including the respective processes.

The method of producing the light emitting diode according to the invention will now be described in detail.

Epitaxial Process

Figure 3:
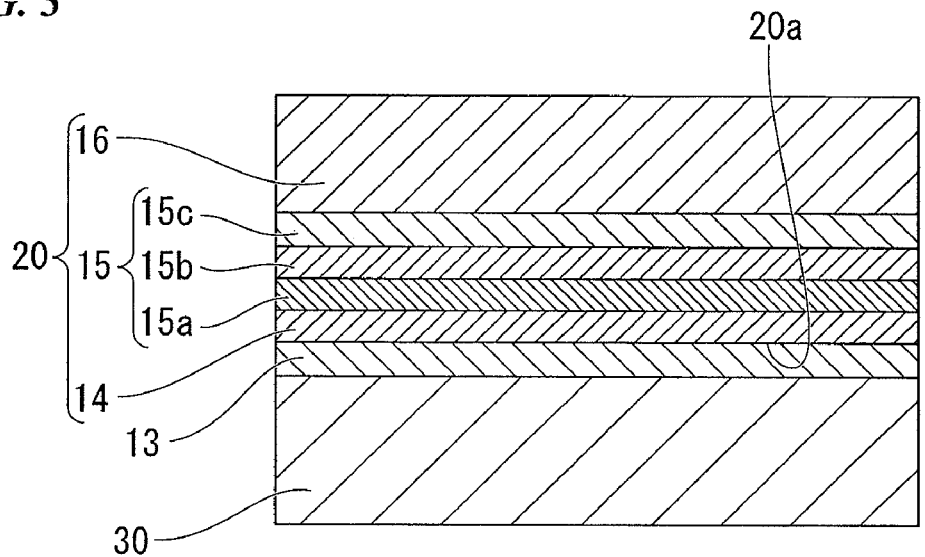
FIG. 3 is a cross-sectional view schematically showing a light emitting diode according to an embodiment of the invention, in which a layer structure of a semiconductor stacked wafer is shown.

As shown in FIG. 3, in the epitaxial process, the substrate 30 for epitaxial growth made of Si-doped GaAs single crystal having a surface inclined at 2 to 20 degrees with respect to a (100) plane and having an n-type property is prepared. The buffer layer 13, the n-type semiconductor layer 14, the light emitting layer 15 and the p-type semiconductor layer 16 are stacked on the substrate 30 for epitaxial growth in this order to form the compound semiconductor layer 20.

In this embodiment, a buffer layer 13 made of Si-doped GaAs and having an n-type property is formed on the substrate 30 for epitaxial growth through the epitaxial process, and then the n-type semiconductor layer 14 made of Si-doped $(Al_{0.5}Ga_{0.5})_{0.5}In_{0.5}P$, the light emitting layer 15, and the p-type semiconductor layer 16 made of Mg-doped GaP and having a p-type property are formed on the buffer layer 13. The light emitting layer 15 is composed of the n-type clad layer 15a, the multi-quantum well layer 15b and the p-type clad layer 15c which are stacked on each other. More specifically, the n-type clad layer 15a is made of Si-doped $(Al_{0.7}Ga_{0.3})_{0.5}In_{0.5}P$ and has an n-type property. The multi-quantum well layer 15b has 20 pairs of barrier layers made of undoped $(Al_{0.2}Ga_{0.8})_{0.5}In_{0.5}P$ and well layers made of $(Al_{0.7}Ga_{0.3})_{0.5}In_{0.5}P$ which are alternatively stacked on each other. The p-type clad layer 15c doped with Mg has a p-type property, and is composed of a second clad layer made of $(Al_{0.7}Ga_{0.3})_{0.5}In_{0.5}P$ and a thin film made of $(Al_{0.5}Ga_{0.5})_{0.5}In_{0.5}P$. The process of sequentially stacking the above layers will be described.

In the epitaxial process according to the embodiment, when each of the buffer layer 13, the n-type semiconductor layer 14, the light emitting layer 15 and the p-type semiconductor layer 16 which are made of the above composition is formed, the respective layers are formed on the substrate 30 for epitaxial growth by a reduced-pressure metal organic chemical vapor deposition (MOCVD) method using a raw material of a Group III component element, such as trimethyl aluminium (($CH_3)_3Al$), trimethyl gallium (($CH_3)_3Ga$), and trimethyl indium (($CH_3)_3In$).

As a material for doping Mg when the p-type clad layer 15c and the p-type semiconductor layer 16 are formed, the above-mentioned bis(cyclopentadienyl)magnesium (bis-$(C_5H_5)_2$Mg) may be used. Also, as a material for doping Si when the n-type semiconductor layer 14 and the n-type clad layer 15a are formed, disilane ($Si_2H_6$) may be used.

Also, phosphine ($PH_3$) or arsine ($AsH_3$) may be used as a raw material of a Group V component element.

As a growth temperature when the compound semiconductor layer 20 is formed, for example, the p-type semiconductor layer 16 made of GaP may be formed at a temperature of approximately 700 to 780° C. Other layers, in other words, the respective layers including the buffer layer 13, the n-type semiconductor layer 14 and the light emitting layer 15 may be formed at a growth temperature of approximately 700 to 780° C.

The buffer layer 13 made of GaAs has a carrier concentration of approximately $0.1 \times 10^{18}$ cm$^{-3}$ to $5 \times 10^{18}$ cm$^{-3}$, similar to that of the single-crystal substrate, and a film thickness of approximately 0.1 to 1 μm.

The n-type semiconductor layer 14 made of $(Al_{0.5}Ga_{0.5})_{0.5}In_{0.5}P$ has a carrier concentration of approximately $0.1 \times 10^{18}$ cm$^{-3}$ to $5 \times 10^{18}$ cm$^{-3}$ and a film thickness of approximately 1 to 8 μm.

The n-type clad layer 15a constituting the light emitting layer 15 has a carrier concentration of approximately $1 \times 10^{17}$ cm$^{-3}$ to $30 \times 10^{17}$ cm$^{-3}$ and a film thickness of approximately 0.1 to 2 μm. The multi-quantum well layer 15b is undoped, and has a film thickness of approximately 0.2 to 2 μm.

The p-type clad layer 15c has a carrier concentration of approximately $1 \times 10^{17}$ cm$^{-3}$ to $20 \times 10^{17}$ cm$^{-3}$ and a film thickness of approximately 0.1 to 3 μm.

The p-type semiconductor layer 16 has a carrier concentration of approximately $0.5 \times 10^{18}$ cm$^{-3}$ to $5 \times 10^{18}$ cm$^{-3}$ and a film thickness of approximately 0.5 to 20 μm. If the film thickness of the p-type semiconductor layer 16 is thin, the current diffusion is insufficient, and the electric current is not uniformly supplied to the light emitting layer 15, thereby causing a decrease in light emission efficiency. Also, if the film thickness is unnecessarily thick, the cost is increased, and the growth of the layer may be technically difficult. In addition, if the carrier concentration of the p-type semiconductor layer 16 is low, the current diffusion is insufficient. If the carrier concentration of the p-type semiconductor layer 16 is too high, the crystal quality may be deteriorated.

Bonding Process

Figure 4:
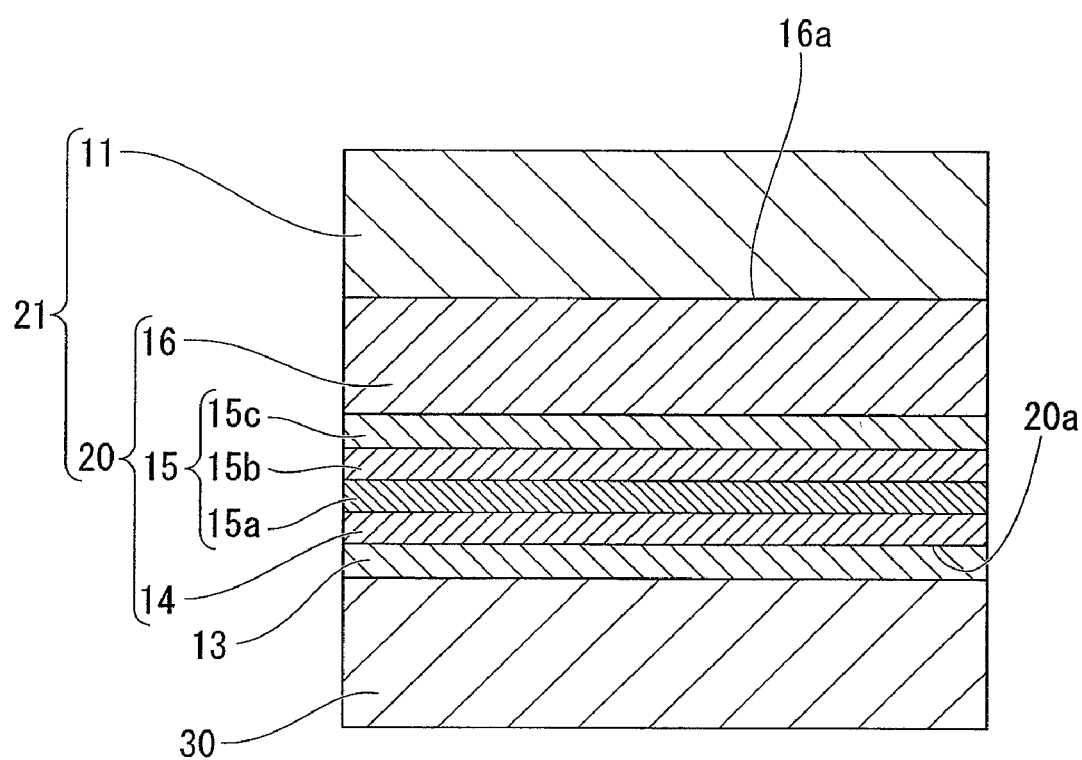
FIG. 4 is a cross-sectional view schematically showing a light emitting diode according to an embodiment of the invention, in which a layer structure of a semiconductor stacked wafer is shown.

In the bonding process, the substrate 11 is bonded to the p-type semiconductor layer 16 of the compound semiconductor layer 20, as shown in FIG. 4.

A GaP single-crystal substrate added with Si to have a carrier concentration of approximately $0.5 \times 10^{17}$ cm$^{-3}$ to $5 \times 10^{17}$ cm$^{-3}$ and having (111) crystal plane orientation is preferably used as the substrate 11. The substrate 11 has a diameter of, for example, approximately 50 mm and the thickness of approximately 50 to 250 µm, and any substrate generally used in the field of stacked semiconductor may be used without any limitations. The substrate 11 is made to have a surface roughness of 3 nm or less, preferably 0.2 nm or less, which is a value of a root mean square (RMS), by subjecting the main surface 11a to mirror polishing, etching or the like.

Then, the p-type semiconductor layer 16 of the compound semiconductor layer 20 is bonded onto the substrate 11. In this instance, a generally used semiconductor material adhering apparatus may be utilized, and a known method, such as a thermal compression bonding method or an adhesive, may be utilized without any limitations. Preferably, a room-temperature bonding method of low stress and strong joint strength is utilized. In the case of utilizing such a method, the substrate 11 and a wafer with the compound semiconductor layer 20 formed on the substrate 30 for epitaxial growth are carried in the semiconductor material bonding apparatus, and then the apparatus is evacuated and decompressed.

After that, an Ar beam is irradiated onto the main surface 11a of the substrate 11 and the surface 16a of the p-type semiconductor layer 16, respectively.

The p-type semiconductor layer 16 (the surface 16a) of the compound semiconductor layer 20 is laid on the main surface 11a of the substrate 11, and then is directly bonded thereto at room temperature by applying a load to each surface with a pressure of 10 to 500 g/cm$^2$.

Although a detailed description is omitted, a method of interposing an adhesive substrate between the substrate 11 and the p-type semiconductor layer 16 formed on the compound semiconductor layer 20 may be utilized in this embodiment. In this instance, after the adhesive substrate is adhered to the surface 16a of the p-type semiconductor layer 16 formed on the compound semiconductor layer 20 or the substrate 11, the substrate 11 and the compound semiconductor layer 20 may be bonded to each other.

Removing Process

Next, in the removing process, the substrate 30 for epitaxial growth is removed from the compound semiconductor layer 20 to expose the light emitting surface 20a, thereby forming the stacked semiconductor wafer 21.

More specifically, the substrate 30 for the epitaxial growth and the buffer layer 13 may be subjected to a method known in the related art such as mechanical polishing or etching, but it is preferable that a selectively etching method using an ammonia-based etchant is employed in consideration of process convenience.

n-Type Electrode (First Electrode) Forming Process (1)

Next, in the n-type electrode (first electrode) forming process (1) and the n-type electrode forming process (2) described below, as shown in FIGS. 5A to 5D, the n-type electrode (first electrode) 8 composed of the wiring electrode 81, the ohmic electrode 82, the translucent electrode 83 and the bonding pad electrode 84 is formed on the n-type semiconductor layer 14 provided on the compound semiconductor layer 20.

Figure 5A:
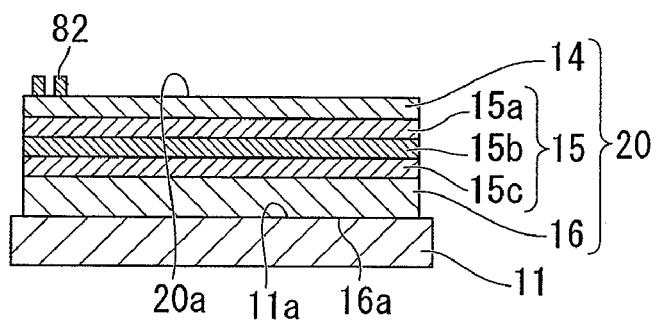
FIGS. 5A to 5D are process views schematically showing a method of producing a light emitting diode according to an embodiment of the invention to explain a process of forming a first electrode (n-type electrode) on a compound semiconductor layer.

First, in the n-type electrode forming process (1), as shown in FIG. 5A, the plurality of ohmic electrodes 82 are formed on the n-type semiconductor layer 14. In this embodiment, as shown in FIG. 1, the ohmic electrode 82 is formed between the wiring electrode 81 described below and the p-type electrode 9 by uniformly disposing the ohmic electrode therebetween, and is disposed to enclose the p-type electrode 9 formed in the pectinate shape at planar view.

In this instance, for example, a method of depositing AuGe/Ni/Au films having the thickness of 0.1 to 0.8 µm on the n-type semiconductor layer 14 by a vacuum deposition method and patterning the films by a photolithography means may be employed. As a result, the plurality of ohmic electrodes 82 may be formed in a circular shape at planar view, as shown in FIGS. 1 and 2.

p-Type Electrode (Second Electrode) Forming Process

Next, in the p-type electrode (second electrode) forming process, after the ohmic electrode 82 is formed on the n-type semiconductor layer 14 during the n-type electrode forming process (1), the p-type electrode (second electrode) 9 is formed in the exposed region provided on the p-type semiconductor layer 16 (see FIGS. 1 and 2).

In this embodiment, as shown in the plan view of FIG. 1, the p-type electrode 9 is formed in a pectinate shape (i.e., E-shape) in planar view.

More specifically, a portion of the compound semiconductor layer 20 is first removed by a method such as wet etching or dry etching to expose a portion of the p-type semiconductor layer 16 and thus form the exposed region.

A stacked layer such as an AuBe alloy film or AuZn having the thickness of 0.1 to 1 µm and an Au film having the thickness of 1 to 3 µm is deposited on the exposed region by a general vacuum deposition method or a sputtering method. Then, the layer is annealed and alloyed at a temperature of 400 to 500° C. during 5 to 20 minutes to form the p-type electrode 9 having low contact resistance. In this instance, a barrier metal such as Pt, Ti, Cr, W, or Mo may be interposed between the alloy layer and the Au film.

n-Type Electrode (First Electrode) Forming Process (2)

Figure 5B:
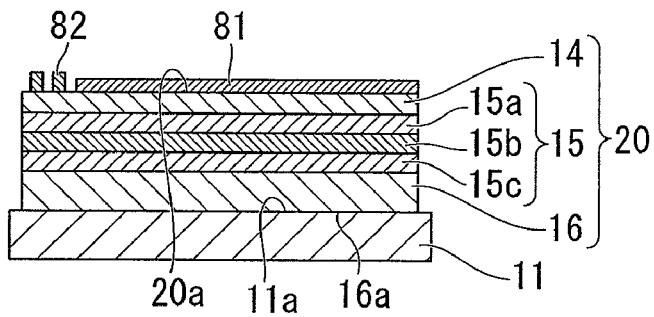

Next, in the n-type electrode (first electrode) forming process (2), after the p-type electrode 9 is formed on the exposed region of the p-type semiconductor layer 16 during the p-type electrode forming process, as shown in FIG. 5B, an Au film having a thickness of approximately 0.3 to 0.8 µm is formed on the n-type semiconductor layer 14 to form the wiring electrode 81. In this embodiment, as shown in FIG. 2, the wiring electrode 81 which is formed in a long sideways form, is formed at two positions on the n-type semiconductor layer 14 in parallel with each other. In this instance, for example, after an Au film, an Ag film, a Cu film, an Al film or the like having reflectivity of 90% or more is deposited on the n-type semiconductor layer 14, the film is patterned by a general photolithography means.

Figure 5C:
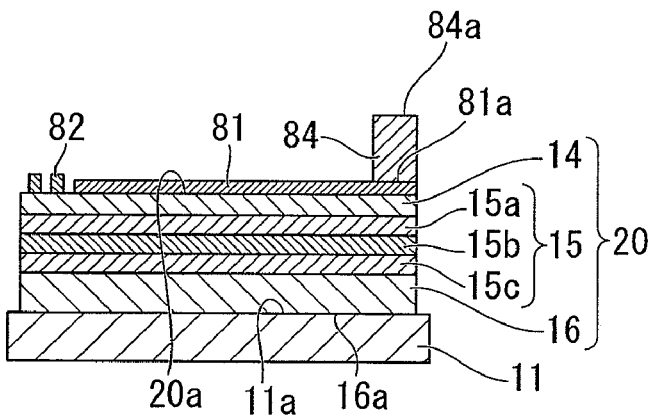

And then, as shown in FIG. 5C, the bonding pad electrode 84 is formed in the pad formation region 81c on the wiring electrode 81. In this instance, for example, the bonding pad electrode 84 can be formed by depositing the Au film on the pad formation region 81c of the wiring electrode 81 made of the Au film to have the thickness of 1 to 3 µm. The method of forming the bonding pad electrode 84 can employ any method known in the related art without any limitations. Also, a barrier metal such as Pt, Ti, Cr, W, or Mo may be interposed between the wiring electrode 81 made of the Au film and the bonding pad electrode 84 to further improve the bonding property.

Figure 5D:
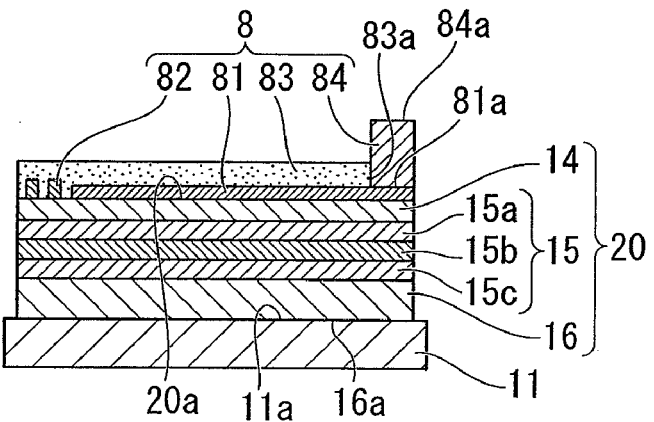

As shown in FIG. 5D, the contact portion 84a of the bonding pad electrode 84 is exposed to the exterior, and the translucent electrode 83 is formed on the compound semiconductor layer 20 so as to cover the wiring electrode 81 and the ohmic electrode 82. In this instance, for example, a translucent electrode material such as ITO, AZO, IZO, GZO or the like as described above is deposited on the n-type semiconductor layer 14 by a method known in the related art to have the thickness of approximately 0.3 to 1 µm, so that the translucent electrode 83 can be formed. When the translucent electrode 83 is formed, the wiring electrode 81 and the ohmic electrode 82 are entirely covered, and the contact portion 84a of the bonding pad electrode 84 is exposed to the exterior from the opening 83a.

In this embodiment, the n-type electrode 8 is formed on the n-type semiconductor layer 14 in the order of the n-type electrode forming process (1) and the n-type electrode forming process (2).

In the production method according to the embodiment, before the n-type electrode 8 is formed in the above order, it is preferable that the light emitting surface of the compound semiconductor layer 20 is subjected to a roughening process in regard to the excellent light extraction efficiency, thereby obtaining the light emitting diode with high luminance.

Cutting Process

Next, in the cutting process, the stacked semiconductor wafer 21 is cut by, for example, dicing, scribing or using a laser into element unit chips to form the light emitting diode 1.

More specifically, the substrate 11 is cut in a square shape (e.g., a square shape with 1000 µm edges) in planar view by using a dicing saw to form the light emitting diode 1 of chip shape, as shown in FIG. 1.

After cutting by the dicing, a fractured layer may occur at each side of the substrate 11 due to the cutting. In this instance, each side is preferably subjected to chemical etching to remove the fractured layer.

Also, for the purpose of enhancing the light extraction efficiency in the inside of the substrate 11, for example, in the case where each side of the substrate 11 is roughened, a method of subjecting each side to chemical treatment may be employed in view of keeping costs low.

As described above, the method of producing the light emitting diode 1 according to the embodiment can enhance the light extraction efficiency, and the embodiment can obtain high productivity of the light emitting diode 1 which has enhanced luminance.

Lamp

The lamp may be configured by using the light emitting diode according to the invention and a means known to those skilled in the art. Such a lamp may include a shell-type lamp for general purposes, a side view-type lamp for mobile device, a top view-type lamp for display, and so forth.

For example, as shown in FIGS. 6 and 7, in the case where the light emitting diode 1 of coplanar electrode type is applied to the top view-type lamp, the substrate 11 of the light emitting diode 1 is adhered to any one of an n-electrode terminal 43 and a p electrode terminal 44 formed on a surface of a mounting substrate 45 (the n-electrode terminal 43 in FIGS. 6 and 7). Also, a p-type electrode 9 of the light emitting diode 1 is bonded to the p electrode terminal 44 by a wire 46 (at two positions in the shown embodiment), and an n-type electrode 8 is bonded to the n-electrode terminal 43 by a wire 47 (at two positions in the shown embodiment). By molding the light emitting diode 1 with a transparent mold resin 41, a top view-type lamp 4 can be produced, as shown in FIGS. 6 and 7.

The lamp 4 according to the embodiment is produced by employing the light emitting diode 1 according to the invention, so that the lamp has a significantly high luminance and an excellent light emitting property.

EXAMPLES

A light emitting diode, a production method thereof, and a lamp according to the invention will be described in detail, but the invention is not limited thereto.

Example 1

FIGS. 1 and 2 are views schematically showing a light emitting diode produced according to an example. FIG. 1 is a plan view of the light emitting diode, and FIG. 2 is a cross-sectional view taken along the line I-I in FIG. 1. FIGS. 3 and 4 are cross-sectional views schematically showing a layer structure of a semiconductor stacked wafer. FIGS. 5A to 5D are process views showing a process of forming an n-type electrode (first electrode) on a compound semiconductor layer. FIGS. 6 and 7 are cross-sectional views schematically showing a lamp produced by using the light emitting diode shown in FIG. 1.

In the example, an epitaxially stacked structure (a semiconductor stacked wafer) formed on a substrate for epitaxial growth made of GaAs was bonded onto a substrate made of GaP to produce a light emitting diode emitting red light and having a light emitting layer made of AlGaInP-based compound semiconductor. Further, a top view-type lamp was produced by using the light emitting diode.

Growth of Compound Semiconductor Layer (Epitaxial Process)

First, a substrate 30 for epitaxial growth made of a Si-doped GaAs single crystal having a surface inclined at 15 degrees with respect to a (100) crystal plane was prepared, the Si-doped substrate 30 having an n-type property.

A buffer layer 13 made of Si-doped GaAs and having an n-type property was formed on the substrate 30 for epitaxial growth, and then an n-type semiconductor layer 14 made of Si-doped $(Al_{0.5}Ga_{0.5})_{0.5}In_{0.5}P$, an Si-doped light emitting layer 15 having an n-type property, and a p-type semiconductor layer 16 made of Mg-doped GaP and having a p-type property were formed on the buffer layer 13. The light emitting layer 15 was composed of an n-type clad layer 15a, multi-quantum well layer 15b, and the p-type clad layer 15c which were stacked on each other. The n-type clad layer 15a was made of Si-doped $(Al_{0.7}Ga_{0.3})_{0.5}In_{0.5}P$ and had an n-type property. The multi-quantum well layer 15b had 20 pairs of barrier layers made of undoped $(Al_{0.2}Ga_{0.8})_{0.5}In_{0.5}P$ and well layers made of $(Al_{0.7}Ga_{0.3})_{0.5}In_{0.5}P$ which were alternatively stacked on each other. The Mg-doped p-type clad layer 15c had a p-type property, and was composed of a second clad layer made of $(Al_{0.7}Ga_{0.3})_{0.5}In_{0.5}P$ and a thin film made of $(Al_{0.5}Ga_{0.5})_{0.5}In_{0.5}P$.

In this example, when each of the buffer layer 13, the n-type semiconductor layer 14, the light emitting layer 15 and the p-type semiconductor layer 16 which were made of the above composition was formed, the respective layers was formed on the substrate 30 for epitaxial growth by a reduced-pressure metal organic chemical vapor deposition (MOCVD) method using a raw material of a Group III component element, such as trimethyl aluminium $((CH_3)_3Al)$, trimethyl gallium $((CH_3)_3Ga)$, and trimethyl indium $((CH_3)_3In)$.

As a raw material for doping Mg when the p-type clad layer 15c and the p-type semiconductor layer 16 were formed, the above-mentioned bis(cyclopentadienyl)magnesium (bis-$(C_5H_5)_2Mg$) was used. Also, as a material for doping Si when the n-type semiconductor layer 14 and the n-type clad layer 15a were formed, disilane ($Si_2H_6$) was used.

Also, phosphine ($PH_3$) or arsine ($AsH_3$) was used as a raw material of a Group V component element.

As for growth temperature of each layer, the p-type semiconductor layer 16 made of GaP was formed at a temperature of 750° C., and the respective layers including the buffer layer 13, the n-type semiconductor layer 14 and the light emitting layer 15 were formed at a temperature of 730° C.

The buffer layer 13 made of GaAs was formed to have a carrier concentration of approximately $5 \times 10^{18}$ $cm^{-3}$ and a film thickness of approximately 0.2 µm in the above film formation process.

The n-type semiconductor layer 14 was formed to have a carrier concentration of approximately $2 \times 10^{18}$ $cm^{-3}$ and a film thickness of approximately 3 µm.

The n-type clad layer 15a constituting the light emitting layer 15 was formed to have a carrier concentration of approximately $8 \times 10^{17}$ $cm^{-3}$ and a film thickness of approximately 1 µm. The multi-quantum well layer 15b was formed to have an undoped film thickness of approximately 0.8 µm, and the p-type clad layer 15c was formed to have a carrier concentration of approximately $2 \times 10^{17}$ $cm^{-3}$ and a film thickness of approximately 1 µm.

The p-type semiconductor layer 16 was formed to have a carrier concentration of approximately $3 \times 10^{18}$ $cm^{-3}$ and a film thickness of approximately 9 µm.

By the above process, the n-type semiconductor layer 14, the light emitting layer 15 and the p-type semiconductor layer 16 were stacked on the substrate 30 for epitaxial growth in this order to form a compound semiconductor layer 20.

Bonding of Compound Semiconductor Layer and Substrate (Bonding Process)

Next, the substrate 11 was bonded to the p-type semiconductor layer 16 of the compound semiconductor layer 20 formed in the above process.

In this instance, the surface of the p-type semiconductor layer 16 was subject to mirror polishing with respect to a depth of approximately 1 µm in such a way that the surface roughness of the p-type semiconductor layer 16 became approximately 0.18 nm.

The substrate 11 made of GaP was prepared as a support substrate to be bonded onto the surface of the p-type semiconductor layer 16. A GaP single-crystal substrate added with Si to have a carrier concentration of approximately $2 \times 10^{17}$ $cm^{-3}$ and having (111) crystal plane orientation was used as the substrate 11. The substrate 11 had a diameter of approximately 50 mm and the thickness of approximately 250 µm. The substrate 11 was made to have a surface roughness of approximately 0.12 nm which was a value of a root mean square (RMS), by subjecting the main surface 11a to the mirror polishing. In this example, as shown in FIG. 2, an adhesive substrate made of the same material as that of the above-mentioned substrate 11, and with a thickness thinner than that of the substrate 11 and subjected to mirror polishing was prepared.

Then, the substrate 11, the adhesive substrate and a wafer with the compound semiconductor layer 20 formed on the substrate 30 for epitaxial growth were carried in the semiconductor material bonding apparatus, and then the apparatus was decompressed by pressure of approximately $3 \times 10^{-5}$ Pa. After that, an Ar beam was irradiated onto the main surface 11a of the substrate 11, both surfaces of the adhesive substrate and the surface of the p-type semiconductor layer 16 for about 3 minutes. In the apparatus in which the vacuum was maintained, the main surface 11a of the substrate 11 was laid on one surface of the adhesive substrate, and the surface of the p-type semiconductor layer 16 was laid on the other surface of the adhesive substrate. Next, the substrates were directly bonded to each other at room temperature by applying a load to each surface with a pressure of 200 $g/cm^2$.

Removing of Substrate for Epitaxial Growth (Removing Process)

Next, the substrate 30 for epitaxial growth was removed from the compound semiconductor layer 20 to expose the light emitting surface 20a, thereby forming the stacked semiconductor wafer 21. In this instance, the substrate 30 for the epitaxial growth and the buffer layer 13 were selectively removed by using an ammonia-based etchant.

Formation of an n-Type Electrode (First Electrode Forming Process) and Formation of p-Type Electrode (Second Electrode Forming Process)

Next, the n-type electrode (first electrode) 8 composed of the wiring electrode 81, the ohmic electrode 82, the translucent electrode 83 and the bonding pad electrode 84 was formed on the n-type semiconductor layer 14 provided on the compound semiconductor layer 20. The p-type electrode (second electrode) 9 was formed in the exposed region provided on the p-type semiconductor layer 16.

First, AuGe/Ni/Au alloy films having the thickness of 0.3 µm were sequentially deposited on the light emitting surface 20a of the n-type semiconductor layer 14 by a vacuum deposition method, and were patterned by a photolithography method, thereby forming a plurality of ohmic electrodes 82 in a circular shape at planar view. In this instance, the ohmic electrode 82 was uniformly disposed between the wiring electrode 81 described below and the p-type electrode 9, and was formed to enclose the p-type electrode 9 (see FIG. 1).

Then, the light emitting surface 20a was treated by hydrochloric acid to roughen the surface, thereby forming an uneven surface having a height of approximately 0.3 µm.

A portion of the compound semiconductor layer 20 formed on the substrate 11 was removed by dry etching to expose the p-type semiconductor layer 16, which forms the exposed region in a pectinate shape (i.e., E-shape) at planar view. Then, a stacked layer composed of an AuBe alloy film having the thickness of 0.2 µm and an Au film having a thickness of 1.8 µm was deposited on the exposed region by a vacuum deposition method in this order from the surface side in the exposed region.

Next, the layer was annealed and alloyed at a temperature of 450° C. for 10 minutes to form the p-type electrode 9 having low contact resistance. At the same time, the ohmic electrode 82 was subjected to heat treatment.

An Au film having a thickness of approximately 0.3 µm was formed on the light emitting surface 20a of the exposed n-type semiconductor layer 14, and was patterned by a photolithography method to form the wiring electrode 81. In this instance, the wiring electrode 81 was formed in an elongated shape, and was disposed between the teeth portions of the p-type electrode 9 formed in the pectinate shape in planar view, thereby forming two wiring electrodes 81.

Next, a Pt film having a thickness of 0.2 µm and an Au film having the thickness of 1.1 µm were deposited on the pad formation region 81c of the wiring electrode 81 by a vacuum deposition method to form a bonding pad electrode 84. In this instance, the Au layer forming the bonding pad electrode had a reflectivity of 93%.

And, in order to expose the contact portion 84a of the bonding pad electrode 84 to the exterior, ITO was deposited to cover the wiring electrode 81 and the ohmic electrode 82 to have the thickness of 0.5 µm, thereby forming a translucent electrode 83 on the n-type semiconductor layer 14. The resistivity of the ITO forming the translucent electrode 83 was 0.3 mΩcm. In this instance, the translucent electrode 83 was formed to wholly cover the wiring electrode 81 and the ohmic electrode 82, and the contact portion 84a of the bonding pad electrode 84 was exposed to the exterior from the opening 83a.

Chip Separation (Cutting Process)

Next, the stacked semiconductor wafer 21 was cut in a square shape at planar view by using a dicing method to form element unit chips.

After the compound semiconductor layer 20 was etched and removed along a predetermined cutting line, the substrate was cut using a dicing saw. After separating by dicing, a fractured layer formed at each side of the substrate 11 due to cutting was etched by using a solution mixed with sulfuric acid and hydrogen peroxide solution. Also, each side was immersed in a hydrochloric acid-based etchant to roughen each surface.

Through the above processes, the light emitting diode 1 of a chip shape was produced in a square shape with approximately 960 μm edges at planar view.

Production of Lamp

A top view-type lamp 4 was produced by mounting the light emitting diode 1 obtained by the above process, as shown in FIGS. 6 and 7.

The substrate 11 of the light emitting diode 1 was adhered to the n-electrode terminal 43 provided on the surface of the mounting substrate 45. Then, a p-type ohmic electrode 9 of the light emitting diode 1 was bonded to the p electrode terminal 44 by a wire 46, and an n-type ohmic electrode 8 was bonded to the n-electrode terminal 43 by a wire 47. By molding the light emitting diode 1 with a mold resin 41 of transparent resin, the lamp 4 was produced, as shown in FIGS. 6 and 7.

Measurement of Light Emission Property

In the lamp 4 mounted with the light emitting diode 1 which was obtained in the above order, when a forward current flowed between each element of the n-type ohmic electrode 8 and the p-type ohmic electrode 9 via the n-electrode terminal 43 and the p-electrode terminal 44, red light having a dominant wavelength of 620 nm was emitted. Also, when a forward current (If) of 400 mA flowed between the respective electrodes, a forward voltage (Vf) was approximately 2.3V due to reflection of a good ohmic property. Also, when a forward current was 20 mA, the light emission intensity (Iv) had a high luminance of 50 μm, since the light emission efficiency of the light emitting layer 15 was enhanced due to the configuration of the n-type electrode 8 as described above and the enhanced light extraction efficiency of the light emitting surface 20a. Visual observation of the appearance of 1000 chips produced in the example produced results in which no damaged wiring electrodes were confirmed.

As a result of the above, the light emitting diode according to the invention and a lamp employing the same have excellent light extraction efficiency and high luminance.

Comparative Example

Figure 9:
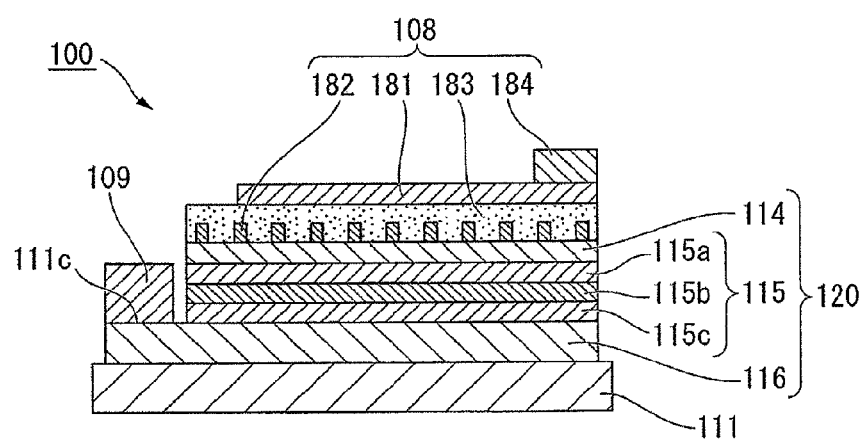
FIG. 9 is a cross-sectional view schematically showing a light emitting diode of a related art.

In this comparative example, a light emitting diode 100 was produced in the same order as that of the example 1, as shown in FIG. 9, except that an n-type electrode was formed on a compound semiconductor layer 120, a wiring electrode 181 was formed on a translucent electrode 183, and a Cr film (not shown) was formed at the interface between the electrodes by a sputtering method. In addition, a top view-type lamp was produced in the same order as that of the example 1 by using the light emitting diode 100. In this instance, the reflectivity of the Cr film was 65%.

In the lamp mounted with the light emitting diode produced in the comparative example, when a forward current (If) flowed between each element of the n-type ohmic electrode and the p-type ohmic electrode via the n-electrode terminal and the p-electrode terminal, red light having a dominant wavelength of 620 nm was emitted. However, when a forward current (If) of 400 mA flowed between each electrode, forward voltage (Vf) was approximately 2.6V and light emission intensity (Iv) was 46 lm, which is apparently lowered in comparison with the example 1. Also, visual observation of the appearance of 1000 chips produced in the comparative example results in which 4 damaged wiring electrodes were confirmed.

It seems that since the light emitting diode 100 produced according to the comparative example is a configuration in which the wiring electrode 181 was provided on the translucent electrode 183 via the Cr film, an electric current does not easily flow between the wiring electrode 181 and the p-type electrodes 109, and the electric current is not effectively supplied to the whole compound semiconductor layer 120 having the light emitting layer. Also, since the Cr film is provided at the interface between the wiring electrode 181 and the translucent electrode 183, the light emitted from the light emitting layer 115 (the compound semiconductor layer 120) is absorbed by the Cr film, thereby lowering the light extraction efficiency. The reason why the wiring electrode is damaged is that the wiring electrode made of the soft Au film is exposed from the surface, and thus the expose surface is likely damaged during the process.

Example 2

Figure 8A:
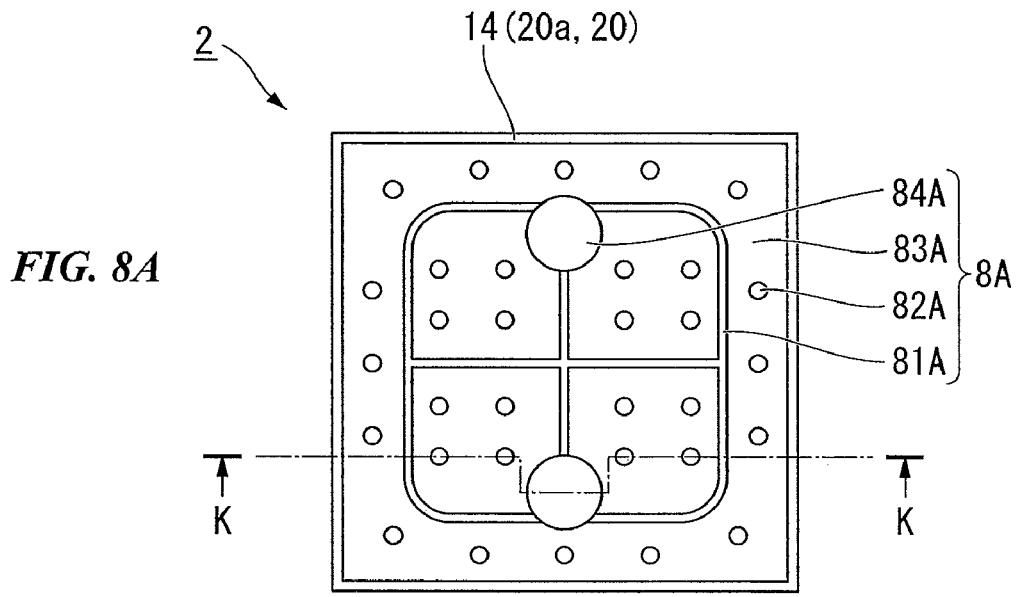
FIGS. 8A to 8C are views schematically showing a light emitting diode having a vertical electrode structure according to an embodiment of the invention.
Figure 8B:
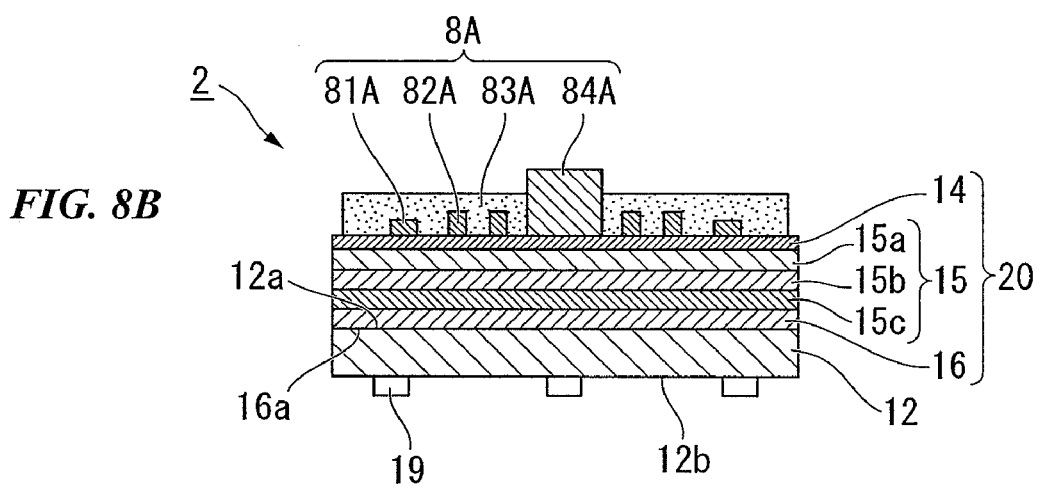
Figure 8C:
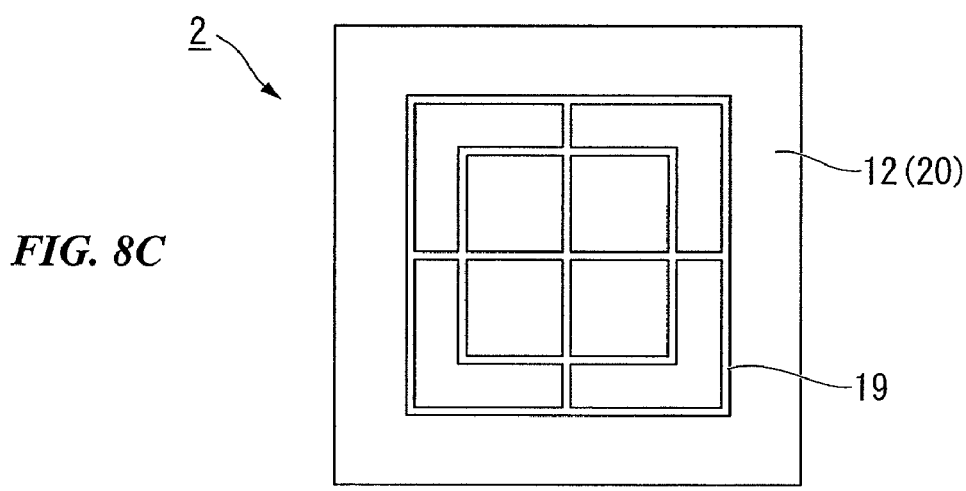

In this example, a light emitting diode 2 was produced in the same method as that of the example 1, as shown in FIGS. 8A to 8C, except that a p-type electrode 19 was formed on a rear surface 12b of a substrate 12 made of GaP to form a vertical electrode structure.

Bonding of Substrate

In this example, a substrate 12 which is a p-type GaP single-crystal substrate was bonded onto a p-type semiconductor layer 16 (surface 16a) of a compound semiconductor layer 20 formed in the same order as that of the example 1. The substrate 12 added with Zn to have the carrier concentration of approximately $1 \times 10^{18}$ cm$^{-3}$ and having q (100) crystal plane orientation was a p-type single-crystal substrate, and the substrate having a diameter of approximately 50 mm and a thickness of approximately 250 μm was prepared. Also, the substrate 12 had a surface roughness of approximately 0.11 nm which is a value of a root mean square (RMS), by subjecting a main surface 12a to mirror polishing.

Formation of n-Type Electrode (First Electrode) and Formation of a p-Type Electrode (Second Electrode)

Next, an n-type electrode 8A composed of a wiring electrode 81A, an ohmic electrode 82A, a translucent electrode 83A and a bonding pad electrode 84A was formed on an n-type semiconductor layer 14 in the same order as that in the example 1. In this example, as shown in FIGS. 8A and 8B, an n-type electrode 8A was formed to have a configuration in which the ohmic electrode 82A was uniformly disposed around the wiring electrodes 81A arranged in a lattice pattern.

Also, a stacked layer composed of an AuBe alloy film having the thickness of 0.2 μm and an Au film having a thickness of 1 μm was deposited on a rear surface 12b of the substrate 12 by a vacuum deposition method in this order. Next, the layer was annealed and alloyed at a temperature of 450° C. during 10 minutes to form a p-type electrode 19 having low contact resistance. In this instance, the layer was patterned by a photolithography method to form the p-type electrodes 19 in a lattice shape at two positions of the rear surface 12b of the substrate 12, as shown in FIG. 8C. Visual observation of the appearance of 1000 chips produced in the example produced results in which no damaged wiring electrodes were confirmed.

Production of Lamp

A top view-typed lamp was produced by mounting the light emitting diode 2 obtained by the above process.

Measurement of Light Emission Property

In the lamp mounted with the light emitting diode 2 which was obtained in the above order, when a forward current (If) flowed between each electrode of the n-type ohmic electrode 8A and the p-type ohmic electrode 19 via the n-electrode terminal and the p-electrode terminal, red light having a dominant wavelength of 620 nm was emitted. Also, when a forward current (If) of 400 mA flowed between each electrode, a forward voltage (Vf) was approximately 2.2V due to reflection of a good ohmic property. Also, when a forward current (If) was 400 mA, the light emission intensity was enhanced to improve the light emission efficiency, due to the configuration of the compound semiconductor layer and the substrate as described above. Further, since the side of the substrate is roughened, the light extraction efficiency to the outside is enhanced to obtain a high luminance of 49 lm.

As a result, it is apparent that the light emitting diode 2 utilizing the GaP substrate and having the vertical electrode structure according to the invention, and the lamp employing the light emitting diode can enhance the light extraction efficiency, so that the lamp has enhanced luminance.

Therefore, the light emitting diode according to the invention and the lamp employing the light emitting diode can enhance the light emission efficiency and the light extraction efficiency, so that the luminance of the lamp is enhanced. Also, none of the electrode patterns of the light emitting diode according to the invention are limited to the examples, and any configuration having a combination of various shapes may be achieved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A light emitting diode comprising:
a substrate;
a compound semiconductor layer comprising a light emitting layer formed on the substrate;
a first electrode formed on an upper surface of the compound semiconductor layer: and
a second electrode formed on the substrate or a semiconductor layer which is exposed by removing at least a portion of the compound semiconductor layer;
wherein the first electrode comprises
a wiring electrode provided on the compound semiconductor layer in contact therewith;
an ohmic electrode provided on the compound semiconductor layer in contact therewith;
a translucent electrode formed over the compound semiconductor layer to cover the wiring electrode and the ohmic electrode; and
a bonding pad electrode connected to the wiring electrode, at least a portion of the bonding pad electrode being exposed from an opening of the translucent electrode to the exterior.

2. The light emitting diode according to claim 1, wherein the translucent electrode is made of indium tin oxide (ITO).

3. The light emitting diode according to claim 1, wherein resistivity of the wiring electrode is 20 μΩcm or less, and resistivity of the translucent electrode is 1 mΩcm or less.

4. The light emitting diode according to claim 1, wherein a relationship between a thickness t1 of the wiring electrode, a thickness t2 of the ohmic electrode, a thickness t3 of the translucent electrode and a thickness t4 of the bonding pad electrode is expressed in the following equation, $$t4 > t3 > t2, t1.$$

5. The light emitting diode according to claim 1, wherein a relationship between thickness t1 of the wiring electrode, thickness t2 of the ohmic electrode, thickness t3 of the translucent electrode and thickness t4 of the bonding pad electrode satisfies equations (1) to (3) below:

$$t4 > 2 \times t3 \quad (1)$$

$$t3 > 1.25 \times t2 \quad (2)$$

$$t3 > 1.25 \times t1 \quad (3).$$

6. The light emitting diode according to claim 1, wherein reflectivity of the wiring electrode and reflectivity of the bonding pad electrode are equal to or more than 90% with respect to a light emitted from the compound semiconductor layer having the light emitting layer.

7. The light emitting diode according to claim 1, wherein the wiring electrode is provided on at least a portion of the compound semiconductor layer, and a total length of the wiring electrode is 1 mm or more.

8. The light emitting diode according to claim 1, wherein the wiring electrode comprises an Au film or an Ag film, and the bonding pad electrode comprises a Pt film and an Au film which are sequentially stacked in a pad formation region on the wiring electrode.

9. The light emitting diode according to claim 1, wherein at least a portion of a surface of the compound semiconductor layer is formed to be in a rough state, the translucent electrode being formed on the surface of the compound semiconductor layer.

10. The light emitting diode according to claim 1, wherein the substrate is made of a translucent material.

11. The light emitting diode according to claim 10, wherein the substrate is made of GaP.

12. The light emitting diode according to claim 1, wherein the compound semiconductor layer is composed of a p-type semiconductor layer, a light emitting layer and an n-type semiconductor layer which are sequentially stacked on a main surface of the substrate.

13. The light emitting diode according to claim 12, wherein the first electrode is an n-type electrode formed on the n-type semiconductor layer, and the second electrode is a p-type electrode formed in an exposed region on the p-type semiconductor layer or the main surface of the substrate.

14. The light emitting diode according to claim 1, wherein the light emitting layer is made of a Group III-V compound semiconductor.

15. The light emitting diode according to claim 14, wherein the light emitting layer is made of a GaP based compound semiconductor.

16. The light emitting diode according to claim 14, wherein the light emitting layer is made of an AlGaInP based compound semiconductor.

17. A method of producing the light emitting diode according to claim 1, comprising:
- an epitaxial step of forming a compound semiconductor layer by stacking at least an n-type semiconductor layer, a light emitting layer and a p-type semiconductor layer in this order on a substrate for epitaxial growth;
- a bonding step of bonding the compound semiconductor layer and a substrate:
- a removing step of removing the substrate for epitaxial growth from the compound semiconductor layer to expose a light emitting surface and thus form a stacked semiconductor wafer;
- a second electrode forming step of forming a second electrode in an exposed region by removing at least a portion of the compound semiconductor layer to expose the main surface of the substrate;
- a first electrode forming step of forming a first electrode by forming a wiring electrode on the compound semiconductor layer, forming an ohmic electrode on the compound semiconductor layer, forming a bonding pad electrode in a pad formation region on the wiring electrode, exposing at least a portion of the bonding pad electrode, and forming a translucent electrode formed over the compound semiconductor layer to cover the wiring electrode and the ohmic electrode; and
- a separating step of cutting the stacked semiconductor wafer into element unit chips.

18. A light emitting diode obtained by the production method according to claim 17.

19. A lamp employing the light emitting diode according to claim 1.

* * * * *